(12) United States Patent
Vogelsang

(10) Patent No.: US 6,813,193 B2
(45) Date of Patent: Nov. 2, 2004

(54) MEMORY DEVICE AND METHOD OF OUTPUTTING DATA FROM A MEMORY DEVICE

(75) Inventor: Thomas Vogelsang, Jericho, VT (US)

(73) Assignee: Infineon Technologies, AG, Munich (DE)

( * ) Notice: Subject to any disclaimer, the term of this patent is extended or adjusted under 35 U.S.C. 154(b) by 58 days.

(21) Appl. No.: 10/406,019

(22) Filed: Apr. 2, 2003

(65) Prior Publication Data

US 2004/0196699 A1 Oct. 7, 2004

(51) Int. Cl.[7] .............................................. G11C 7/00
(52) U.S. Cl. ........................ 365/189.05; 365/189.02; 365/230.3
(58) Field of Search ...................... 365/189.02, 189.03, 365/230.02, 230.03

(56) References Cited

U.S. PATENT DOCUMENTS 6,189,070 B1 * 2/2001 See et al. ................... 711/103
6,301,150 B1 * 10/2001 Kanamitsu et al. ...... 365/185.03
6,546,510 B1 * 4/2003 Mazumder et al. ......... 714/718

OTHER PUBLICATIONS

"Double Data Rate (DDR) SDRAM Specification", JEDEC Standard, JESD79C (Revision of JESD79, Release 2), Mar. 2003.

* cited by examiner

Primary Examiner—Vu A. Le
(74) Attorney, Agent, or Firm—Brinks Hofer Gilson & Lione

(57) ABSTRACT

A method of outputting data from a memory device, such as a dynamic random access memory, is disclosed. The method comprises the steps of providing an integrated circuit having a plurality of memory arrays; separately buffering data from separate memory arrays of the plurality of memory arrays; multiplexing buffered data from the separate memory arrays; and outputting the buffered data from the memory device. A circuit for employing the method is also disclosed.

30 Claims, 5 Drawing Sheets

MEMORY DEVICE AND METHOD OF OUTPUTTING DATA FROM A MEMORY DEVICE

FIELD OF THE INVENTION

The present invention relates generally to memory devices, and in particular, to a method of outputting data from a memory device.

BACKGROUND OF THE INVENTION

As semiconductor manufacturing techniques and processes continue to improve, the size of elements on a integrated circuit continues to decrease, and therefore the number of elements on an integrated circuit continues to increase. One area of semiconductor technology where such improvements can be seen is the manufacture of memory devices, such as dynamic random access memories (DRAMs). While increases in the density of integrated circuits provide many advantages, such increases often result in incompatibility with other devices.

One such example of an increase in density creating compatibility issues has been seen in the transition from DRAMs having a memory size of 64M cells to DRAMs having 256M cells. During this transition, a DRAM having an intermediate memory size of 128M was introduced, in part because of the inability of many memory manufacturers to transition to a memory size of 256M in one step with a cost effective process and die size. In addition to simpler manufacturing, the 128M memory also has the advantage that the number of row addresses is the same as for 64M memory, and the 128M memory could be handled by controllers built for the 64M DRAMs. Some users of DRAMs, such as computer server customers with large memory demands, use stacked devices to maximize available memory on a DIMM. However, as the sizes of the memory grows, older memory controllers will again not be able to handle one chip with an additional row address. A large DRAM which comes early into the market has a limited number of applications since most memory controllers are not designed to support the new size as a single device, especially when a new address is added.

Accordingly, there is a need for memory device and method of an internal DRAM architecture by which a DRAM can be operated like a stacked device with two chip select signals or like a single large device with an additional row address.

BRIEF SUMMARY OF THE INVENTION

This invention describes an internal architecture by which a memory device such as a DRAM can be operated like a stacked device with two CS signals or like a single large device with an additional row address. By giving the integrated circuit the ability to be operated like a stacked (pin-out according to the dual-chip package spec) component or like one device of the next generation chip, one die can be used to cover a larger part of the market and make the transition to a next generation easier.

DETAILED DESCRIPTION OF THE DRAWINGS

Figure 1:
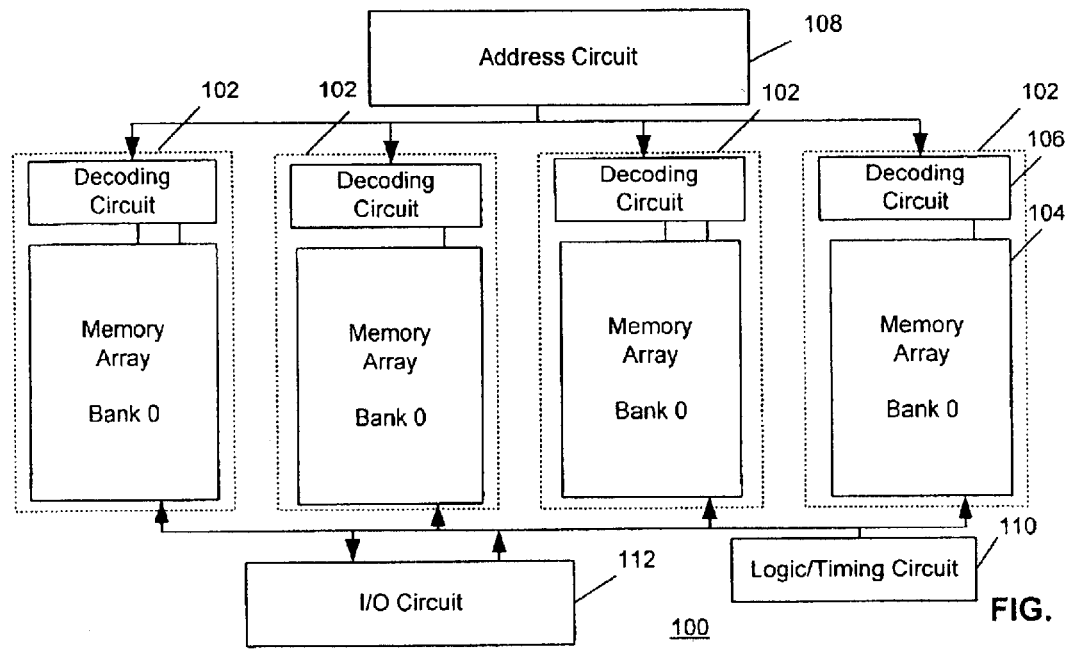
FIG. 1 is a block diagram of memory employing embodiments of the present invention.

Turning first to FIG. 1, a block diagram of memory employing embodiments of the present invention is shown. In particular, a memory device 100 comprises a plurality of memory arrays 102, each of which comprises a memory array bank 104 and a decoding circuit 106. The memory device 100 further comprises an address circuit 108. Finally, a logic/timing circuit 110 receives control signals, which are well known in the art, for reading data from or writing data to the memory device by way of an I/O circuit 112.

Figure 2:
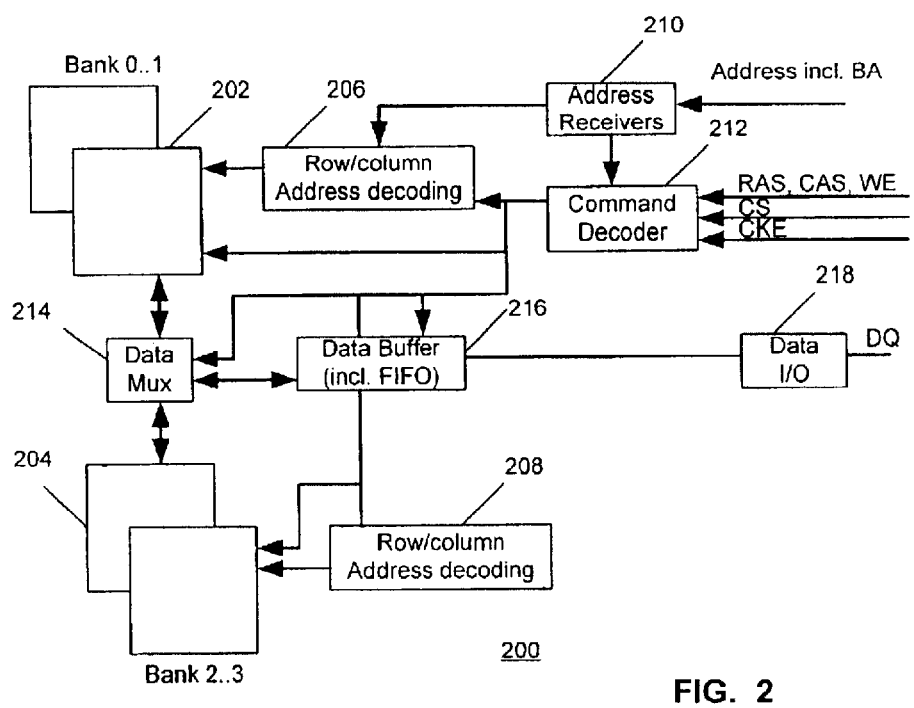
FIG. 2 is a block diagram of a conventional circuit for reading data from a memory cell.
Figure 3:
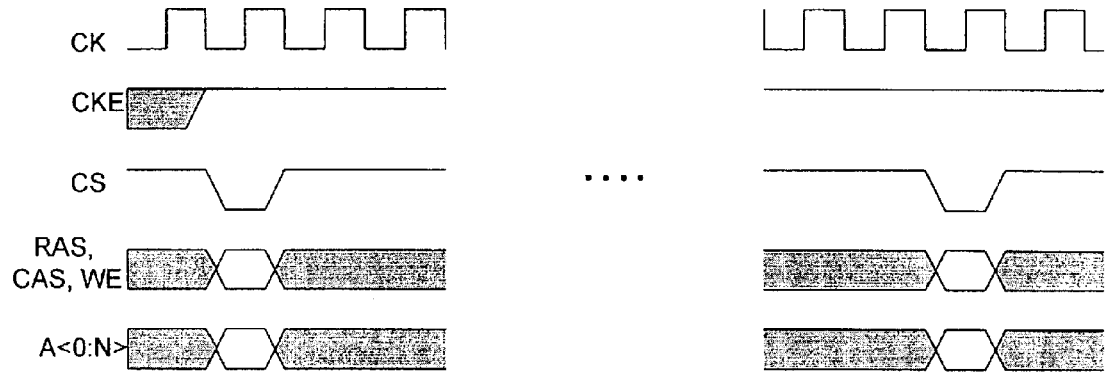
FIG. 3 is a timing diagram showing the operation of the circuit of FIG. 2.

Turning now to FIG. 2, a block diagram of a conventional circuit for reading data from or writing data to a memory cell is shown. In particular, a first bank of memory arrays 202 and a second bank of memory arrays 204 are coupled to row/column address decoding circuits 206 and 208, respectively. An address receiver circuit 210, which receives an address, is coupled to the row/column address decoding circuit 206 and a command decoder 212. A data multiplexer 214 is coupled to the first bank of memory arrays 202 and the second bank of memory arrays 204, and provides data to a data buffer 216. Data is output from the memory device by way of a data I/O circuit 218. The signals row address select (RAS), column address select (CAS); write enable (WE), chip select (CS) and clock enable (CKE) coupled to the command decoder 212 arc used together with the clock (CK) signal (and/CK for a double data rate (DDR) DRAM) to decode commands to the chip. CS is used to identify commands for a specific device when the other signals are connected in parallel to all devices. Data from the two banks of memory arrays is provided to the data buffer 216 by way of the data multiplexer 214. The timing diagram of FIG. 3 shows the operation of the circuit of FIG. 2. In particular, when the clock enable signal (CKE) is high and the chip select signal (CS) is low, commands (activate, read, write, precharge etc. defined by the combined values of RAS, CAS, WE) are issued to the memory and data are received or sent in the event of a read or write. The affected memory cells are identified by the address A<0:N>.

Figure 4:
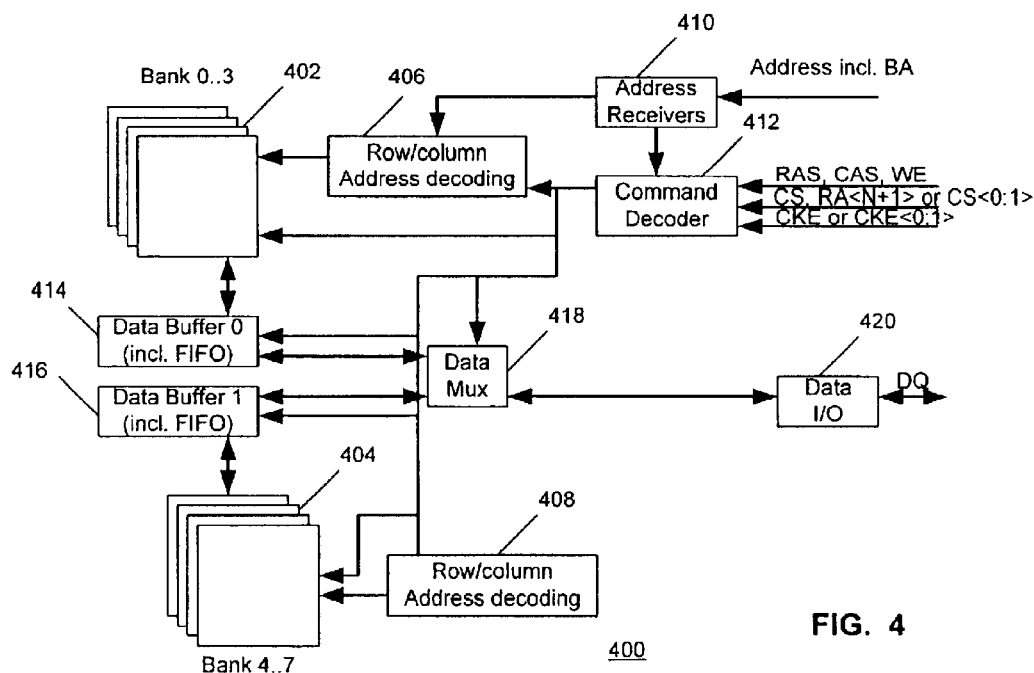
FIG. 4 is a block diagram of a circuit for reading data from a memory cell according to an embodiment of the present invention.

Turning now to FIG. 4, a block diagram of a circuit for reading data from a memory cell according to an embodiment of the present invention is shown. In particular, a first bank of memory arrays 402 and a second bank of memory arrays 404 are coupled to row/column address decoding circuits 406 and 408, respectively. An addresses receiver circuit 410, which receives an address, is coupled to row/column address decoding circuit 406 and a command decoder 412. As can be seen in FIG. 4, two CS signals and two CKE signals are employed, depending upon whether the device configured to operate as two separate SDRAMs or a single DRAM (in which case an additional row address signal (RA<N+1>) is employed.

Because the datapath is separated into two parts with separate parts of the total memory associated with them, the common part of the datapath (i.e. the path between the data multiplexer 418 and the data I/O 420) has to be able to operate in less than a clock cycle so that no data contention occurs when the controller operates on both virtual devices (designated by CS<0> and CS<1>) on back-to-back cycles. Address and command path operation without contention in back-to-back cycles is well known in the art in circuitry shared between different banks of a standard synchronous DRAM.

According to one aspect of the invention, the command decoder can be switched either by a bond option, by a fuse or by a metal option between two different modes of operation. In the first mode the chip is bonded to have two CS signals which let it operate as two separate SDRAMs on one die. Accordingly, one half of the chip can be in self-refresh or standby mode, while the other half is operating.

Figure 5A:
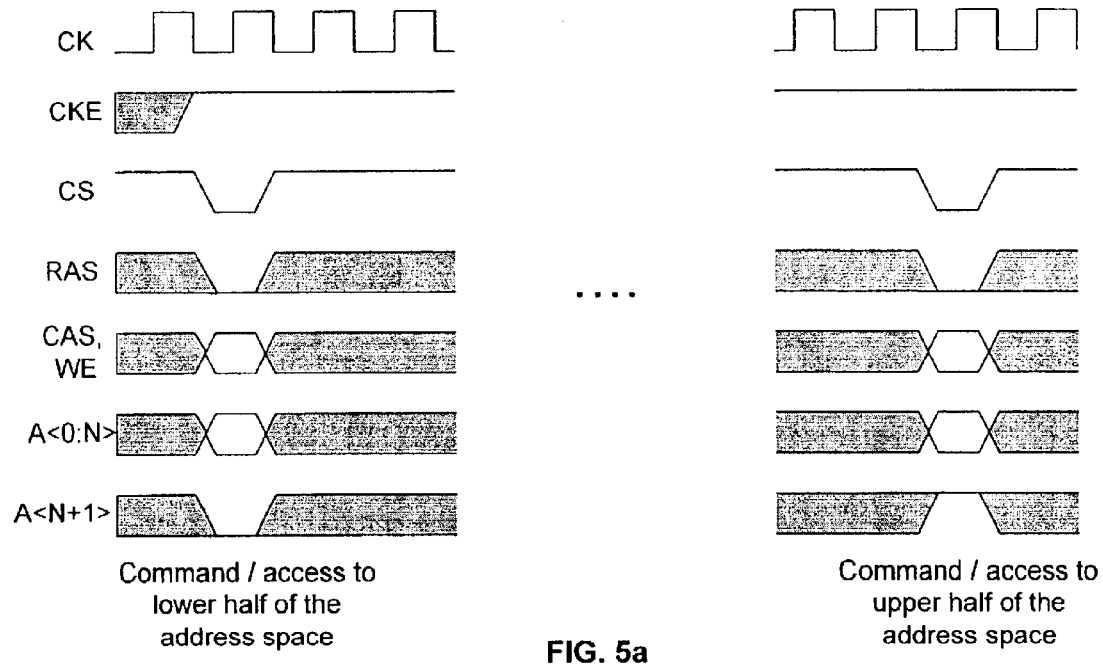
FIGS. 5a and 5b are timing diagrams showing the operation of the circuit of FIG. 4.

Turning now to FIG. 5a, a timing diagram shows the operation of the circuit of FIG. 4 when the integrated circuit is configured as a single memory with doubled density. In particular, when the clock enable signal (CKE) is high and the chip select signal (CS) is low, commands are issued to the memory and in the event of read or write data are read from or sent to the memory. The cells are identified by address A<0:N> and the additional address bit A<N+1>, which identifies either the lower or upper half of the address space. When RAS is low, a row command is selected, and when RAS is high, a column command is selected.

Figure 5B:
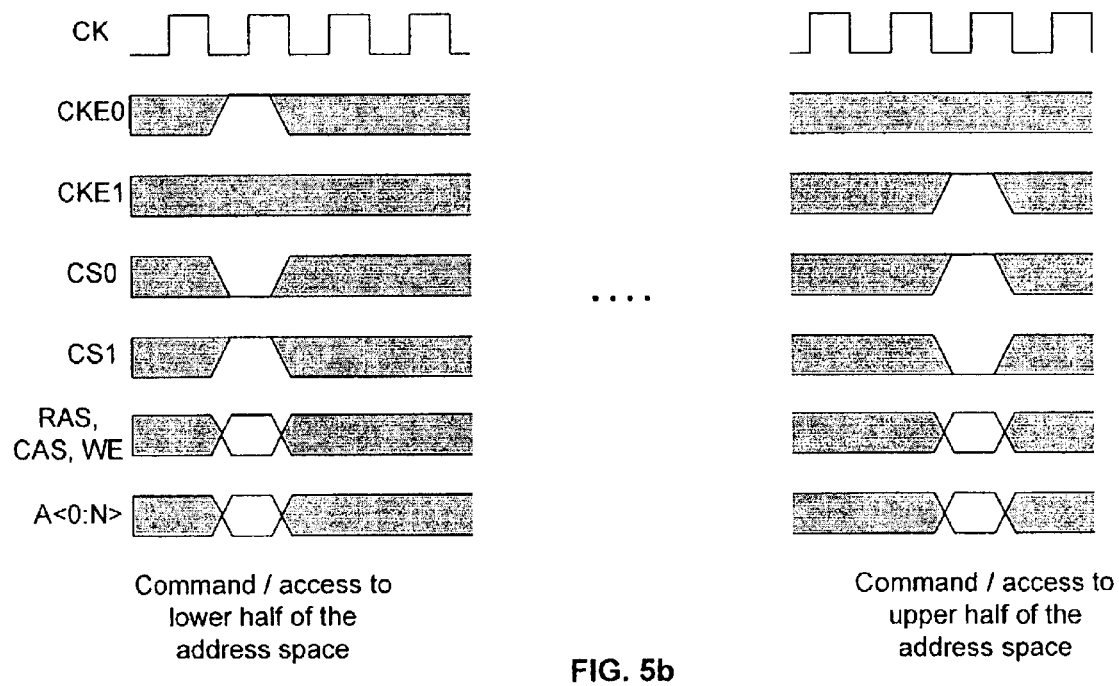

As shown in FIG. 5b, a timing diagram shows the operation of the circuit of FIG. 4 when the integrated circuit is configured as a stacked memory with double density. In particular, separate clock enable signals (CKE0 and CKE1) and chip select signals (CS0 and CS1) are provided. When the clock enable signal (CKE0) is high and the chip select signal (CS0) is low, the operation affects the lower half of the memory address space, where the cells are identified by only the address bus A<0:N>. When the clock enable signal (CKE1) is low and the chip select signal (CS1) is high, the operation affects the upper half of the memory, where the cells are also identified by only the address bus A<0:N>.

Figure 6:
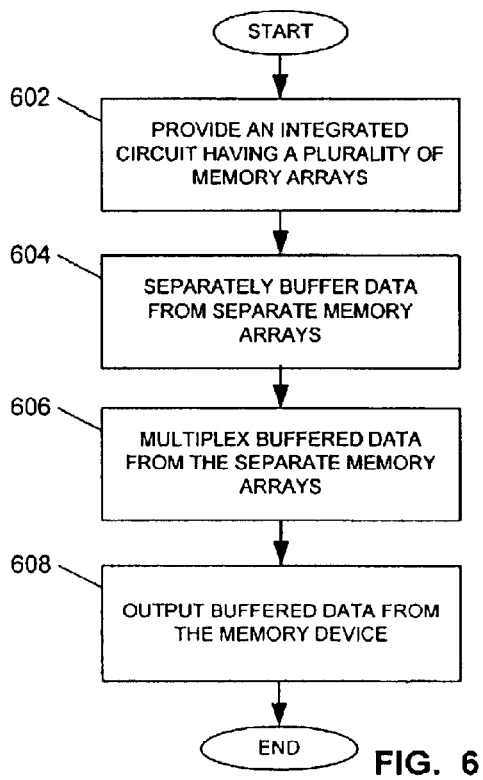
FIG. 6 is a flow chart showing a method of separately buffering data according to an embodiment of the present invention.

Turning now to FIG. 6, a flow chart shows a method of separately buffering data according to an embodiment of the present invention. In particular, an integrated circuit having a plurality of memory arrays is provided at a step 602. Data is then separately buffered from separate memory arrays of the plurality of memory arrays at a step 604. The buffered data from the separate memory arrays is then multiplexed at a step 606. Finally, the buffered data is output from the memory device at a step 608.

Figure 7:
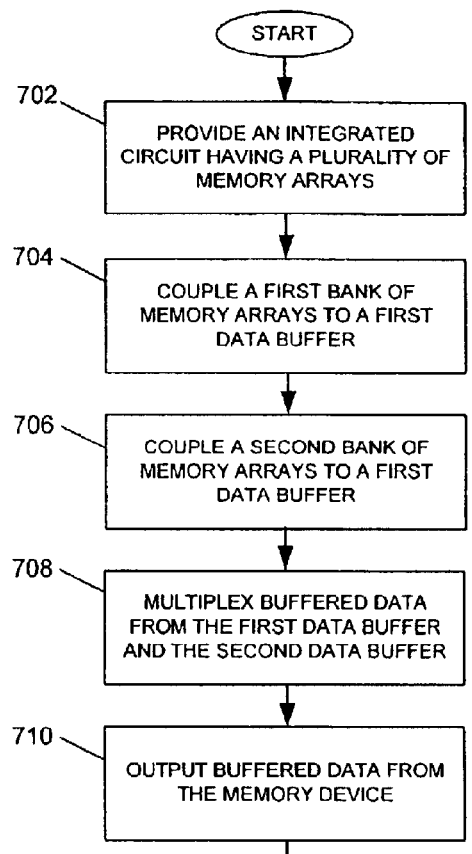
FIG. 7 is a flow chart showing a method of coupling memory arrays to first and second data buffers according to an embodiment of the present invention.

Turning now to FIG. 7, a flow chart shows a method of providing memory arrays to first and second data buffers according to an embodiment of the present invention. In particular, an integrated circuit having a plurality of memory arrays is provided at a step 702. A first bank of memory arrays is coupled to a first data buffer at a step 704. A second bank of memory arrays is then coupled to a second data buffer at a step 706. Data from the first data buffer and the second data buffer is multiplexed at a step 708. Finally, the buffered data is output from the integrated circuit at a step 710.

Figure 8:
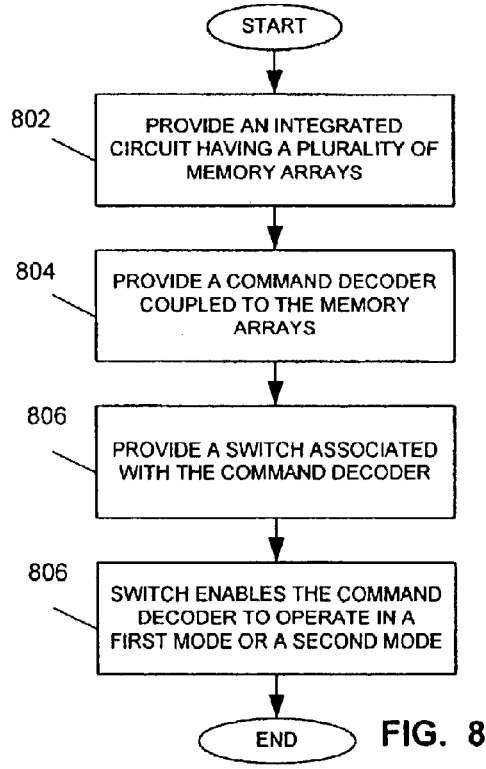
FIG. 8 is a flow chart showing a method of providing a configurable command decoder according to an embodiment of the present invention.

Turning now to FIG. 8, a flow chart shows a method of providing a configurable command decoder according to an embodiment of the present invention. In particular, an integrated circuit having a plurality of memory arrays is provided at a step 802. A command decoder is coupled to the memory arrays at step 804. A switch associated with the command decoder is provided at a step 806. The switch enables the command decoder to operate in two different modes of operation at a step 808.

Figure 9:
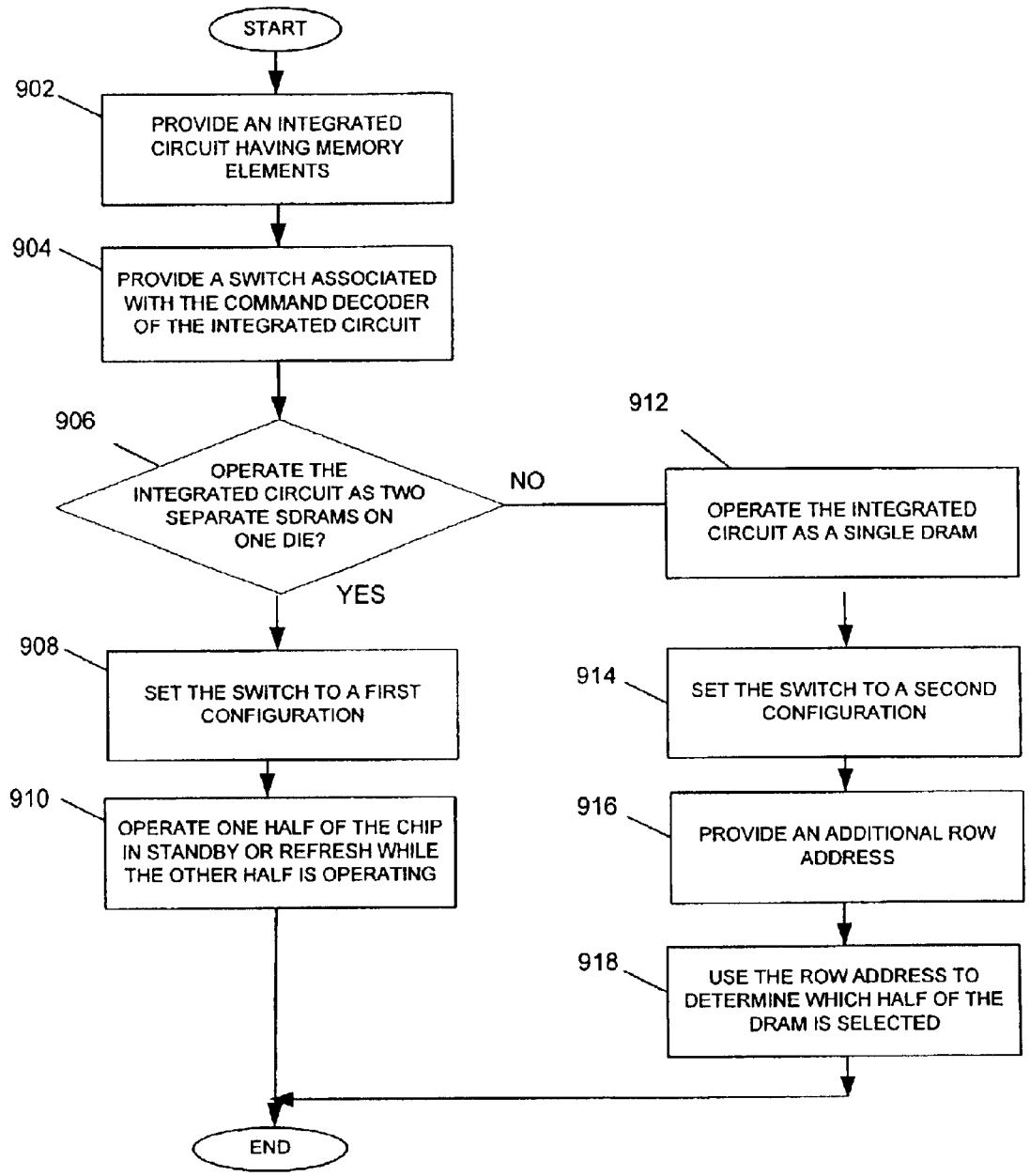
FIG. 9 is a flow chart showing a method of manufacturing a memory device according to an embodiment of the present invention.

Turning now to FIG. 9, a flow chart shows a method of manufacturing a memory device according to an embodiment of the present invention. In particular, an integrated circuit having the elements as provided at a step 902. A switch associated with a command decoder of the integrated circuit is provided at a step 904. It is then determined whether the integrated circuit is to operate as two separate SDRAMs on one die at a step 906. If so, a switch is set to a first configuration at a step 908, and one-half of the chip operates in standby or refresh, while the other chip is operating at a step 910. If not, the integrated circuit will operate as a single DRAM at a step 912. The switch is set to a second configuration at a step 914. An additional row address is provided at a step 916, and a controller of the integrated circuit uses the row address to determine which half of the DRAM is selected at a step 918.

It can therefore be appreciated that the new and novel memory device and method of outputting data from a memory device. It will be appreciated by those skilled in the art that, particular the teaching herein, numerous alternatives and equivalents will be seen to exist which incorporate the disclosed invention. As a result, the invention is not to be limited by the foregoing embodiments, but only by the following claims.

What is claimed is:

1. A method of outputting data from a memory device, said method comprising the steps of:
    providing an integrated circuit having a plurality of memory arrays;
    separately buffering data from separate memory arrays of said plurality of memory arrays;
    multiplexing buffered data from said separate memory arrays; and
    outputting said buffered data from said memory device.

2. The method of claim 1 wherein said step of separately buffering data comprises a step of providing a first data buffer coupled to the first bank of memory arrays and a second data buffer coupled to a second bank of memory arrays.

3. The method of claim 1 wherein said step of multiplexing buffered data comprises a step of multiplexing outputs from a first data buffer and a second data buffer.

4. The method of claim 3 wherein said step of outputting data comprises a step of outputting data from said first data buffer and said second data buffer in a period of one clock cycle of said memory device.

5. The method of claim 4 further comprising a step of providing a separate clock enable signal for a first bank of memory arrays and a second bank of memory arrays.

6. A method of outputting data from a memory device, said method comprising the steps of:
    providing an integrated circuit having a plurality of memory arrays;
    coupling a first bank of memory arrays to a first data buffer;
    coupling a second bank of memory arrays to a second data buffer;
    multiplexing buffered data from said first data buffer and said second data buffer; and outputting said buffered data from said integrated circuit.

7. The method of claim 5 further comprising a step of separately controlling said first data buffer and said second data buffer.

8. The method of claim 7 wherein said step of multiplexing data comprises a step of providing a single output from said first data buffer and said second data buffer.

9. The method of claim 8 wherein said step of providing a single output comprises providing a single output path operating in a time period of one clock cycle.

10. The method of claim 8 further comprising a step of providing a separate clock enable signal for said first bank of memory arrays and a second bank of memory arrays.

11. A method of outputting data from a memory device, said method comprising the steps of:

providing an integrated circuit having a plurality of memory arrays;

providing a command decoder coupled to said plurality of memory arrays; and providing a switch associated with said command decoder, said switch enabling said command decoder to operate in two different modes of operation.

12. The method of claim 11 wherein said step of providing a switch comprises providing a switch which is selected during the manufacture of said memory device.

13. The method of claim 11 wherein said step of providing a switch comprises permanently configuring said memory device.

14. The method of claim 11 further comprising a step of enabling said memory device to operate in a first mode when said switch is configured in a first position.

15. The method of claim 14 further comprising a step of enabling said memory device to operate in a second mode when said switch is configured in a second position.

16. A memory device comprising:

a first bank of memory arrays;

a first data buffer coupled to said first bank of memory arrays;

a second bank of memory arrays;

a second data buffer coupled to said second bank of memory arrays;

a multiplexer coupled to said first data buffer and said second data buffer; and an output circuit coupled to said multiplexer and generating an output signal.

17. The memory device of claim 16 wherein said first data buffer and said second data buffer comprise FIFOs.

18. The memory device of claim 16 further comprising a command decoder coupled to said multiplexer.

19. The memory device of claim 18 further comprising an address receiver coupled to said command decoder.

20. The memory device of claim 16 further comprising a first address decoder coupled to said first bank of memory arrays.

21. The memory device of claim 20 further comprising a second address decoder coupled to said second bank of memory arrays.

22. The memory device of claim 21 further comprising first and second column selects signals coupled to said first and second address decoder.

23. The memory device of claim 21 further comprising first and second clock enable signals coupled to said first and second address decoders.

24. The memory device of claim 16 further comprising a switch coupled to said command decoder, said switch enabling said memory device to operate in a first mode when said switch is configured in a first position and a second mode when said switch is configured in a second position.

25. A memory device comprising:

a first data buffer coupled to a first bank of memory arrays;

a second data buffer coupled to a second bank of memory arrays;

a command decoder coupled to said first data buffer and said second data buffer; and a switch coupled to said command decoder, said switch enabling said memory device to operate in a first mode when said switch is configured in a first position and a second mode when said switch is configured in a second position.

26. The memory device of claim 25 further comprising a multiplexer coupled to said first data buffer and said second data buffer, said multiplexer being controlled by said command decoder.

27. The memory device of claim 25 wherein said first data buffer and said second data buffer comprise FIFOs.

28. The memory device of claim 25 further comprising first and second column selects signals coupled to said first and second address decoders.

29. The memory device of claim 25 further comprising first and second clock enable signals coupled to said first and second address decoders.

30. A memory device comprising:

a first bank of memory arrays;

a first data buffer coupled to said first bank of memory arrays;

a second bank of memory arrays;

a second data buffer coupled to said second bank of memory arrays;

a command decoder coupled to said first and second data buffers;

a multiplexer coupled to said first data buffer and said second data buffer, said multiplexer being controlled by said command decoder;

first and second column selects signals coupled to said first and second address decoders;

first and second clock enable signals coupled to said first and second address decoders;

a switch coupled to said command decoder, said switch enabling said memory device to operate in a first mode when said switch is configured in a first position and a second mode when said switch is configured in a second position.

* * * * *